United States Patent
Morton et al.

(10) Patent No.: US 10,461,384 B2
(45) Date of Patent: Oct. 29, 2019

(54) FREQUENCY SELECTIVE LIMITER

(71) Applicant: Raytheon Company, Waltham, MA (US)

(72) Inventors: Matthew A. Morton, Reading, MA (US); Gerhard Sollner, Winchester, MA (US)

(73) Assignee: Raytheon Company, Waltham, MA (US)

( * ) Notice: Subject to any disclaimer, the term of this patent is extended or adjusted under 35 U.S.C. 154(b) by 26 days.

(21) Appl. No.: 15/627,913

(22) Filed: Jun. 20, 2017

(65) Prior Publication Data

US 2018/0366803 A1 Dec. 20, 2018

(51) Int. Cl.
*H01P 1/23* (2006.01)
*H01P 1/215* (2006.01)
(Continued)

(52) U.S. Cl.
CPC .............. *H01P 1/215* (2013.01); *H01P 1/218* (2013.01); *H01P 1/227* (2013.01); *H01P 1/23* (2013.01);
(Continued)

(58) Field of Classification Search
CPC .. H03H 7/38; H03H 7/40; H01P 1/215; H01P 1/218; H01P 1/23; H01P 3/003; H01P 3/006; H03G 11/006
(Continued)

(56) References Cited

U.S. PATENT DOCUMENTS 4,283,692 A 8/1981 Adam
4,605,911 A 8/1986 Jin
(Continued)

FOREIGN PATENT DOCUMENTS

CN 206639899 11/2017
WO WO 97/44850 11/1997

OTHER PUBLICATIONS

Adam, J. Douglas; "Frequency Selective Limiters for High Dynamic Range Microwave Receivers;" IEEE Transactions on Microwave Theory and Techniques, vol. 41, No. 12; Dec. 1, 1993; pp. 2227-2231 (5 pages).

(Continued)

*Primary Examiner* — Stephen E. Jones
(74) *Attorney, Agent, or Firm* — Daly, Crowley, Mofford & Durkee, LLP (57) ABSTRACT

A frequency selective limiter (FSL) is provided having a transmission line structure with a tapered width. The FSL includes a substrate having a magnetic material, a signal (or center) conductor disposed on the substrate and first and second ground plane conductors disposed on the substrate. The signal conductor having a first end with a first width and a second end with a second different width such that the signal conductor is provided having a taper between the first and second ends of the signal conductor. First and second ground plane conductors are spaced apart from first and second edges of signal conductor, respectively, by a distance that changes from the first end of signal conductor to the second end of signal conductor such that signal conductor, and first and second ground plane conductors form a coplanar waveguide transmission line.

22 Claims, 4 Drawing Sheets

FIG. 1

(51) Int. Cl.
| | |
|---|---|
| H03G 11/00 | (2006.01) |
| H01P 1/218 | (2006.01) |
| H03H 2/00 | (2006.01) |
| H03H 7/38 | (2006.01) |
| H01P 1/22 | (2006.01) |
| H01P 3/00 | (2006.01) |

(52) U.S. Cl.
CPC ........... *H01P 3/003* (2013.01); *H03G 11/006* (2013.01); *H03H 2/001* (2013.01); *H03H 7/38* (2013.01)

(58) Field of Classification Search
USPC ............................................ 333/34, 33, 17.2
See application file for complete search history.

(56) References Cited

U.S. PATENT DOCUMENTS

| | | | |
|---|---|---|---|
| 4,845,439 | A | 7/1989 | Stitzer et al. |
| 4,980,657 | A | 12/1990 | Stitzer et al. |
| 5,023,573 | A | 6/1991 | Adam |
| 6,998,929 | B1 | 2/2006 | Adam |
| 7,656,167 | B1 | 2/2010 | McLean |
| 8,933,763 | B2 | 1/2015 | Fast |
| 9,300,028 | B2 | 3/2016 | Morton et al. |
| 2003/0214364 | A1* | 11/2003 | Cites ............... H01P 5/08 333/33 |
| 2004/0012458 | A1* | 1/2004 | Amparan ............ H01P 1/047 333/34 |
| 2009/0027144 | A1 | 1/2009 | Saito |
| 2011/0043299 | A1 | 2/2011 | Ding et al. |

OTHER PUBLICATIONS

Chua et al.; "Microfabricated Planar Helical Slow-Wave Structures Based on Straight-Edge Connections for THz Vacuum Electron Devices;" Terahertz Science and Technology, ISSN 1941-7411, vol. 4, No. 4; Dec. 1, 2011; pp. 208-229 (22 pages).

S. Seki, et al.; "Cross-Tie Slow-Wave Coplanar Waveguide on Semi-Insulating GaAs Substrates;" Electronic Letters, vol. 17, No. 25; Dec. 10, 1981; pp. 940-941 (2 pages).

Steven N. Stitzer et al.; "A Multi-Octave Frequency Selective Limiter;" IEEE MTT-S Digest; May 31, 1983-Jun. 3, 1983; pp. 326-328 (3 pages).

Stitzer, S.N. et al.; "X-Band YIG Limiters for FM/CW Radar;" Microwave Journal, vol. 20; Dec. 1, 1977; pp. 35-38 (1 page). Abstract Only.

Suhl; "The Nonlinear Behavior of Ferrites at High Microwave Signal Levels;" Proceedings of the IRE, vol. 44, Issue 10; Oct. 1, 1956; pp. 1270-1284 (15 pages).

Office Action dated Jul. 22, 2015; For U.S. Appl. No. 14/077,909; 10 pages.

Response dated Oct. 8, 2015 to Office Action dated Jul. 22, 2015; For U.S. Appl. No. 14/077,909; 11 pages.

Second Response dated Oct. 14, 2015 to Office Action dated Jul. 22, 2015; For U.S. Appl. No. 14/077,909; 11 pages.

Notice of Allowance dated Dec. 8, 2015; For U.S. Appl. No. 14/077,909; 10 pages.

U.S. Appl. No. 16/018,768, filed Jun. 26, 2018, Morton et al.

Thomann; "Characterization and Simulation of Bi-Quadratic Coplanar Waveguide Tapers for Time-Domain Applications"; Microwave Symposium Digest, 1993, IEEE MTT-S International; Jun. 14, 1993; 30 Pages.

PCT Written Opinion of the International Searching Authority dated Nov. 27, 2018, for Application No. PCT/US2018/034369; 11 Pages.

PCT International Search Report dated Nov. 27, 2018, for Application No. PCT/US2018/034369; 6 Pages.

International Search Report and Written opinion dated Jul. 12, 2019 for International Application No. PCT/US2019/031661; 19 Pages.

Johnson; "Tapered Transitions"; EDN Magazine; Oct. 11, 2001; 3 Pages.

Maleszka, et al.; "Broadband Stripline to Microstrip Transition with Constant Impedance Field Matching Section for Applications in Multilayer Planar Technologies"; Radar and Wireless Communications; 18th International Conference on Microwaves; Jun. 14-16, 2010; 4 Pages.

\* cited by examiner

FREQUENCY SELECTIVE LIMITER

GOVERNMENT INTERESTS

This invention was made with government support under Contract No. NOO 173 1 4C2020 awarded by the Office of the Secretary of Defense, administered by Naval Research Laboratories and subcontract SC141002 pursuant thereto. The government has certain rights in this invention.

TECHNICAL FIELD

This disclosure relates generally to limiters and more particularly to frequency selective limiters.

BACKGROUND

As is known in the art, a Frequency Selective Limiter (FSL) is a nonlinear passive device that attenuates signals above a predetermined threshold power level while passing signals below the threshold power level. One feature of the FSL is the frequency selective nature of the high-power limiting: low power signals close in frequency to the limited signals are substantially unaffected (i.e., the FSL does not substantially attenuate such signals).

A typical implementation of an FSL includes a stripline transmission structure using two layers of dielectric material disposed about the stripline, with the stripline having a fixed length and a fixed width along the length of the FSL. Such structures are relatively simple to fabricate and provide adequate magnetic fields to realize a critical power level of approximately 0 dBm when using a single crystal material. One method of reducing the threshold power level is to use a lower-impedance stripline at the cost of degraded return loss. An external matching structure can be used to improve the impedance match, but this technique reduces the bandwidth and increases the insertion loss of the FSL.

SUMMARY

The concepts, systems and techniques disclosed herein are directed toward a frequency selective limiter (FSL) comprising a transmission line structure having a tapered width. The transmission line structure can be provided such that one or more conductors have a first width at a first end (e.g., an input) of the FSL and a second, different width at a second end (e.g., an output) of the FSL. For example, in a transmission line structure having a coplanar design, a center conductor and two ground plane conductors can each have a first width at an input of the FSL and a second, different width at an output of the FSL. In some embodiments, the width of the center conductor decreases (e.g., linearly, exponentially) along a length of the transmission line structure. The dimensions of the tapered width can be selected based, at least in part, upon; dimensions of the FSL (e.g., overall length, width, etc.), a desired signal attenuation factor, a desired characteristic impedance of the FSL, and/or the materials used to form the FSL. In an embodiment, the tapered width results in an FSL having a desirable combination of power threshold, insertion loss, and maximum attenuation range for at least some applications.

The FSL and thus the transmission line structure can include multiple segments (or portions) of arbitrary-width 50Ω coplanar lines. If an input signal is applied or otherwise incident on the FSL that exceeds a power threshold of the first segment, then a subsequent segment in the FSL can be formed to have a narrower width to match the now slightly attenuated signal's power level with a correspondingly lower power threshold. Thus, each individual segment can be formed having a width that matches its power threshold level to the expected large signal power level incident upon that respective segment, where the incident power of a given segment is a function of the large signal attenuation of one or more preceding segments in the transmission line structure prior to the respective segment.

The dimensions and/or profile of the tapered width transmission line can be selected based at least in part on a desired characteristic impedance of the FSL, dimensions of the FSL (e.g., overall length, width, etc.), and/or properties of the materials making up the FSL (e.g., magnetic material properties). The profile of the tapered width can be selected such that in response to a signal having a certain power level (e.g., a sufficiently high input power level), each segment of the FSL provides the same level of attenuation. Thus, the difference in power level between the threshold of a given segment and the incident power to that segment is a constant value. This constant value can correspond to the large signal attenuation of the respective segment. For example, in one embodiment, for an infinitely small segment this constant may be zero, but for a design having a 1 mm long segment size, the constant value can be maintained at 1 dB/mm.

Use of a tapered width transmission line results in a reduced power threshold where the onset of the desired nonlinearity occurs without changing the structure of the magnetic material (e.g., ferrite material) disposed adjacent to the transmission line. This enables the use of lower-cost material for a wide variety of applications, enables the tuning of FSL performance parameters through electrical design rather than material optimization, and provides higher overall nonlinear performance without degrading the insertion loss for weak signals.

In some embodiments, a cascaded FSL can be formed having two or more FSL's coupled together. For example, an output of a first FSL can be coupled to an input of a second FSL. The FSL's can be formed having the same material properties (e.g., same magnetic material). In other embodiments, the FSL's can be formed having different material properties (e.g., different types of magnetic material). Each of the FSL's can include a tapered width transmission line structure. The relationship between the different widths of the transmission line structures can correspond to each other and the materials making up each of the respective FSL's. For example, the width of an input portion of a second transmission line structure formed in the second FSL can be selected based at least in part on the width of an output portion of a first transmission line structure formed in the first FSL, the properties of the materials making up the first FSL and the properties of the materials making up the second FSL.

In a first aspect, a frequency selective limiter is provided comprising a magnetic material having first and second opposing surfaces and a plurality of conductors disposed on the first surface of the magnetic material to form a coplanar waveguide transmission line. A width of a center conductor of the plurality of conductors decreases from a first end of the coplanar waveguide transmission line to a second, different end of the coplanar waveguide transmission line.

In some embodiments, the width decreases linearly along a length of the coplanar waveguide transmission line. In other embodiments, the width decreases exponentially along a length of the coplanar waveguide transmission line.

The plurality of conductors can further comprise two ground plane conductors disposed on the first surface of the magnetic material. A gap can be disposed between the center conductor and each of the two ground plane conductors such that the gap between the center conductor and each of the two ground plane conductors decreases along a length of the coplanar waveguide transmission line.

The coplanar waveguide transmission line may further comprise multiple segments having one or more different widths, and a width of each of the segments can correspond to an attenuation factor of one or more preceding segments in the coplanar waveguide transmission line or a power threshold of the one or more preceding segments in the coplanar waveguide transmission line. Each of the segments may form 50Ω coplanar lines and the frequency selective limiter may have a constant characteristic impedance along the length of the coplanar waveguide transmission line.

In some embodiments, a power threshold of each segment decreases along a length of the coplanar waveguide transmission line. Each segment of the coplanar waveguide transmission line may provide the same level of attenuation to a signal incident on the frequency selective limiter.

In another aspect, a cascaded frequency selective limiter system is provided comprising a first frequency selective limiter comprising a first magnetic material having first and second opposing surfaces and a first plurality of conductors disposed on the first surface of the first magnetic material to form a first coplanar waveguide transmission line such that a first width of a first center conductor of the first plurality of conductors decreases from a first end to a second, different end of the first coplanar waveguide transmission line. The cascaded frequency selective limiter system further comprises a second frequency selective limiter comprising a second magnetic material having first and second opposing surfaces and a second plurality of conductors disposed on the first surface of the second magnetic material to form a second coplanar waveguide transmission line such that a second width of a second center conductor of the second plurality of conductors decreases from a first end to a second, different end of the second coplanar waveguide transmission line. An output of the first frequency selective limiter is coupled to an input of the second frequency selective limiter.

The first width of the first coplanar waveguide transmission line may decrease linearly along a length of the first coplanar waveguide transmission line and the second width of the second coplanar waveguide transmission line may decrease linearly along a length of the second coplanar waveguide transmission line.

In some embodiments, the first and second magnetic materials comprise the same material. In other embodiments, the first and second magnetic materials comprise different material.

The second width of the second center conductor at the first end of the second coplanar waveguide transmission line can correspond to at least one of the first width of the first center conductor at the second end of the first coplanar waveguide transmission line, a material of the first magnetic material or a material of the second magnetic material.

In another aspect, a method for forming a frequency selective limiter is provided comprising providing a magnetic material having first and second opposing surfaces, disposing first and second ground plane conductors on the first surface of the magnetic material and disposing a center conductor on the first surface of the magnetic material such that the center conductor is disposed between the first and second ground plane conductors to form a coplanar waveguide transmission line. A width of the center conductor decreases from a first end to a second, different end of the coplanar waveguide transmission line.

The width may decrease linearly along a length of the coplanar waveguide transmission line. In some embodiments, the width may decrease exponentially along a length of the coplanar waveguide transmission line.

A gap may be formed between the center conductor and each of the first and second ground plane conductors such that the gap between the center conductor and each of the first and second ground plane conductors decreases along a length of the coplanar waveguide transmission line.

Multiple segments may be formed having one or more different widths within the coplanar waveguide transmission line such that a width of each of the segments corresponds to at least one of an attenuation factor of one or more preceding segments in the coplanar waveguide transmission line or a power threshold of the one or more preceding segments in the coplanar waveguide transmission line. Each of the segments may form 50Ω coplanar lines and the frequency selective limiter can have a constant characteristic impedance along the length of the coplanar waveguide transmission line.

The method may further comprise forming multiple frequency selective limiters such that an output of a first frequency selective limiter is coupled to an input of a second frequency selective limiter and a width of the input of the second coplanar waveguide transmission line corresponds to at least one of a width of the output of the first coplanar waveguide transmission line, a material of the first magnetic material and a material of the second magnetic material.

In another aspect, a frequency selective limiter is provided comprising a substrate comprising a magnetic material, said substrate having first and second opposing surfaces, a center conductor disposed on the first surface of said substrate said center conductor having at least a first portion having a first end with a first width and a second end with a second different width such said center conductor is provided having a taper between the first and second ends of said first portion of said center conductor, a first ground plane conductor disposed on the first surface of said substrate with an edge of said first ground plane conductor spaced apart from a first edge of said center conductor by a distance which changes from the first end of the first portion of said center conductor to the second end of the first portion of said center conductor and a second ground plane conductor disposed on the first surface of said substrate with an edge of said second ground plane conductor spaced apart from a second edge of said center conductor by a distance which changes from the first end of the first portion of said center conductor to the second end of the first portion of said center conductor such that said center conductor, and said first and second ground plane conductors form a co-planar waveguide transmission line.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1:
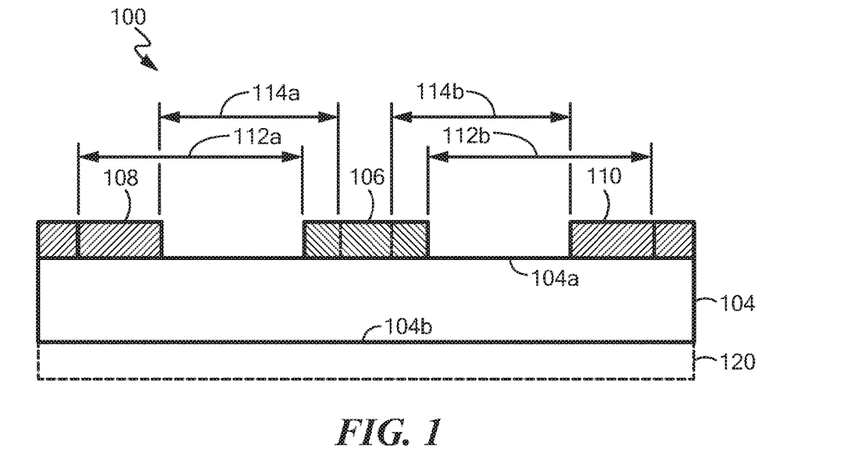
FIG. 1 is a front view of a Frequency Selective Limiter (FSL) having a coplanar waveguide transmission line structure with a tapered width.

Referring now to FIG. 1, a frequency selective limiter (FSL) 100 includes a plurality of spaced apart conductors 106, 108, 110 with a first one of the plurality of conductors correspond to a center (or signal) conductor 106 and second ones of the plurality of conductors corresponding to two ground plane conductors 108, 110. All of the conductors 106, 108, 110 are disposed on a first surface 104a of a magnetic material substrate 104 to form a coplanar waveguide transmission line.

The coplanar waveguide transmission line can be formed or otherwise provided having a tapered width. In one illustrative embodiment, center conductor 106 is spaced (e.g., separated from) varying distances from each of ground plane conductors 108, 110 along a length of FSL 100. For example, center conductor 106 can be spaced a first distance from each of ground plane conductors 108, 110, here represented by gaps 112a, 112b respectively at a first end (e.g., an input) of FSL 100 and spaced a second different distance, here represented by gaps 114a, 114b respectively at a second end (e.g., an output) of FSL 100. In some embodiments, the first distance may be greater than the second distance.

Center conductor 106 and ground plane conductors 108, 110 may include the same material. In other embodiments, center conductor 106 and ground plane conductors 108, 110 may include different materials. Center conductor 106 and ground plane conductors 108, 110 may include a metal or metallic material.

Magnetic material 104 may include a ferromagnetic material, such as Yttrium iron garnet (YIG). For example, magnetic material 104 may include at least one of a single crystal (SC) YIG, polycrystalline (PC) YIG, hexaferrite YIG or a variety of doped YIG materials.

In some embodiments, a ground plane 120 may be disposed on a second surface 104b of magnetic material 104. Ground plane 120 may include at least one of a metal or metallic material.

Figure 1A:
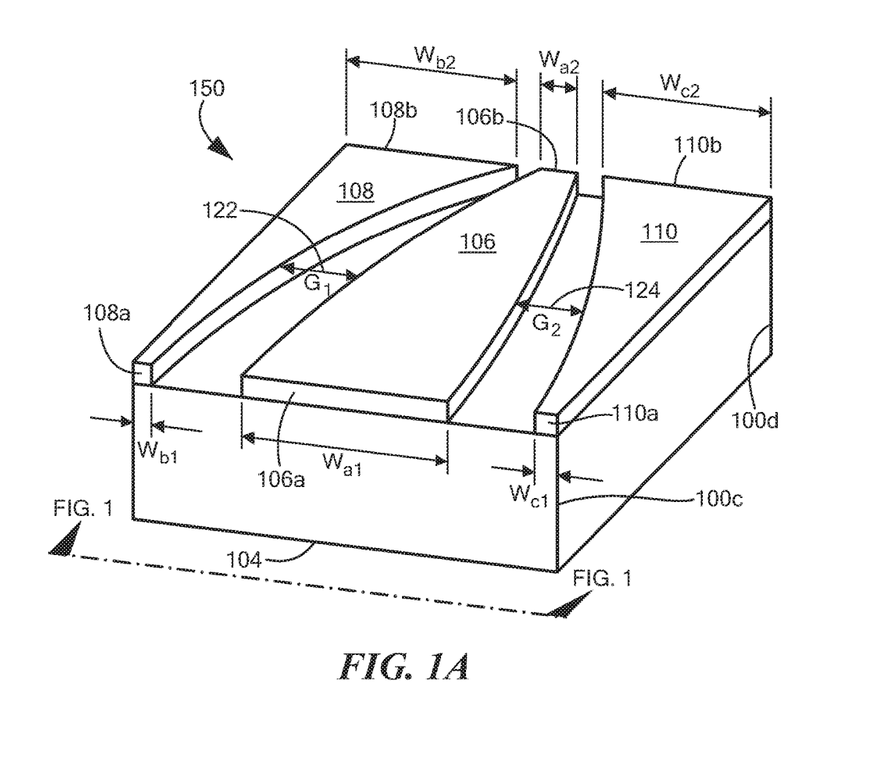
FIG. 1A is an angled side view of an FSL.

Now referring to FIG. 1A, in which like elements of FIG. 1 are provided having like reference designations, a top view of FSL 100 illustrates one example embodiment of the tapered width of the coplanar waveguide transmission structure. As illustrated in FIG. 1A, the widths of center conductor 106 and each of ground plane conductors 108, 110 vary along a length of FSL 100 from a first end 100c (e.g., input) to a second end 100d (e.g., output). For example, center conductor 106 has a first width 106a ($w_{a1}$) at a first end 100c (e.g., input) of FSL 100 and a second different width 106 ($w_{a2}$) at a second end 100d (e.g., output) of FSL 100. In an embodiment, the width of center conductor 106 can decrease (e.g., linearly, exponentially) along a length of FSL 100 from first end 100c to second end 100d. In an embodiment, the width of center conductor 106 is related to the power threshold, so the width is reduced over the length of FSL 100 (e.g., a length of the device) as the power level drops to ensure the threshold stays matched to the power level long the length.

It should be appreciated that in other embodiments, the width of center conductor 106 can increase (e.g., linearly, exponentially) along a length of FSL 100 from first end 100c to second end 100d. However, in such an embodiment, the threshold level would increase at that point above the power level where the desired limiting would occur. Thus, this segment of the FSL would only add to small signal loss and not contribute to the desired large signal attenuation.

First ground plane conductor 108 has a first width 108a ($w_{b1}$) at the first end 100c of FSL 100 and a second different width 108b ($w_{b2}$) at the second end 100d of FSL 100. Second ground plane conductor 110 has a first width 110a ($w_{c1}$) at the first end 100c of FSL 100 and a second different width 110b ($w_{c2}$) at the second end 100d of FSL 100. Thus, in the illustrative embodiment of FIG. 1A, the widths of first and second ground plane conductors 108, 110 increase along a length of FSL 100 from first end 100c to second end 100d. It should be appreciated that, in other embodiments, the widths of first and second ground plane conductors 108, 110 may decrease or be formed having a variety of different shapes along a length of FSL 100 from first end 100c to second end 100d. In an embodiment, the widths of first and second ground plane conductors 108, 110 may be selected based at least in part on a gap between first and second ground plane conductors 108, 110 and center conductor 106.

Center conductor 106 can be spaced from first and second ground plane conductors 108, 110 by a first gap 122 ($G_1$) and a second gap 124 ($G_2$) respectively. Thus, it should be appreciated that in some embodiments, widths of first and second ground plane conductors 108, 110 may be constant along a length of FSL 100 and the width of center conductor 106 and/or the dimensions of gaps 122, 124 between ground plane conductors 108, 110 and center conductor 106 may vary along a length of FSL 100. In other embodiments, widths of first and second ground plane conductors 108, 110 may decrease along a length of FSL 100 and the width of center conductor 106 and/or the dimensions of gaps 122, 124 between ground plane conductors 108, 110 and center conductor 106 may vary along a length of FSL 100. Gaps 122, 124 will be described below in greater detail with respect to FIG. 1B.

In an embodiment, center conductor 106, ground planes 108, 110, and gaps 122, 124 can include multiple segments or portions from first end 100c to second end 100d of FSL 100. Each segment of center conductor 106 and ground planes 108, 110, gaps 122, 124 can have a different width than a preceding or subsequent segments of center conductor 106, ground planes 108, 110 and gaps 122, 124, respectively. Segments may refer to center conductor 106, ground planes 108, 110, and gaps 122, 124 individually or in different combinations with each other. For example, a segment of FSL 100 may refer and thus include a width of center conductor 106 and dimensions of gaps 122, 124 between center conductor 106 and ground planes 108, 110. It should be appreciated that FSL 100 can be described as having segments to more clearly describe what is happening along the length of FSL 100, by discussing the width at discrete cross sections of FSL 100. In other words, the physical implementation of FSL 100 can be a limit where the length of a segment is zero (not actually discretized). For example, in some embodiments, FSL 100 may include a single continuous structure having a continuous, smooth transition in width from first end 100c to second end 100d.

In some embodiments, each segment of center conductor 106 can have a narrower width than a previous segment to match a power threshold of an attenuated signal's power level (attenuated by the previous one or more segments) and have a corresponding lower power threshold than the previous segment. Thus, each individual segment of center conductor 106 can be formed having a width that matches its respective power threshold level to the expected large signal power level incident upon that respective segment, where the incident power of the respective segment is a function of the large signal attenuation of one or more previous segments of center conductor 106.

The width of center conductor 106 and dimensions of gaps 122, 124 can be selected to form 50Ω coplanar lines such that FSL 100 can have a constant characteristic impedance along the length of the coplanar waveguide transmission line. For example, for a coplanar waveguide line such as FSL 100, the dimensions of FSL can be selected based at least in part on the relationship between the width of center conductor 106 and gaps 122, 124 between center conductor 106 and ground planes 108, 110 c. The combination of each of these elements can define the characteristic impedance of FSL 100. For example, by modifying the width of center conductor 106 without changing the dimensions of gaps 122, 124 may lead to a characteristic impedance other than 50 ohms. Thus, it should be appreciated that in some embodiments, tapering the width of center conductor 106, as used herein may refer to tapering the width of center conductor 106 and tapering (or otherwise modify the dimensions) of gaps 122, 124 to maintain a 50 ohm characteristic impedance.

Figure 1B:
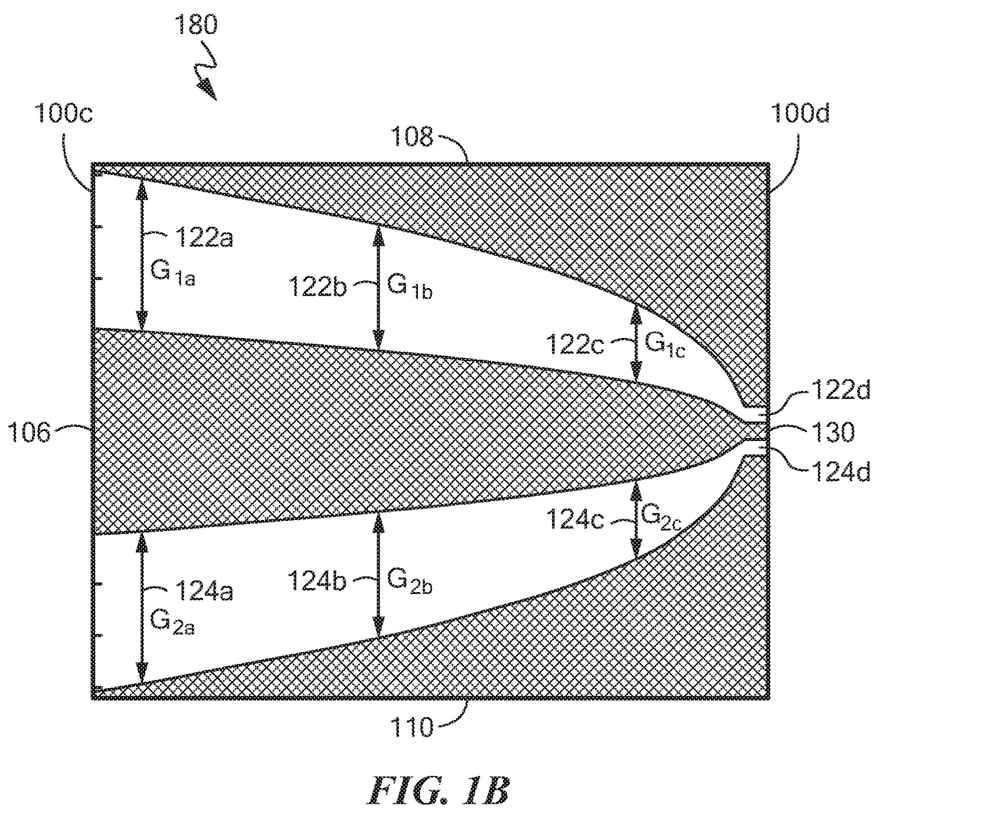
FIG. 1B is a top view of an FSL.

Now referring to FIG. 1B, a top view of a top view of FSL 100 illustrates one example embodiment of the tapered width of the coplanar waveguide transmission structure. In the illustrative embodiment of FIG. 1B, gaps, $G_1$ and $G_2$ vary (here decrease) along a length of FSL 100 from first end 100c to second end 100d.

For example, first gap 122 ($G_1$) between center conductor 106 and first ground plane conductor 108 has a first length 122a ($G_{1a}$) at a first portion of FSL 100, a second length 122b ($G_{1b}$) at a second portion of FSL 100 and a third length 122c ($G_{1c}$) at a third portion of FSL 100. Thus, as the widths of center conductor 106 and/or first ground plane conductor 108 change, the dimensions of first gap 122 $G_1$ separating them can change.

Second gap 124 ($G_2$) between center conductor 106 and second ground plane conductor 110 has a first length 124a ($G_{2a}$) at a first portion of FSL 100, a second length 124b ($G_{2b}$) at a second portion of FSL 100 and a third length 124c ($G_{2c}$) at a third portion of FSL 100. Thus, as the widths of center conductor 106 and/or second ground plane conductor 110 change, the dimensions of second gap 124 ($G_2$) separating them can change.

In the illustrative embodiment of FIG. 1B, first and second gaps, 122, 124 decrease along the length of FSL 100 from first end 100c to second end 100d. However, it should be appreciated that in other embodiments, the dimensions of first and second gaps 122, 124 may stay constant along the length of FSL 100 from first end 100c to second end 100d.

In some embodiments, an end portion 130 (e.g., output portion) of center conductor 106 may have a constant or substantially constant width. For example, and as illustrated in FIG. 1B, end portion 130 has a substantially constant width and a fourth length 122d of first gap 122 and a fourth length 124d of second gap 124 are both substantially constant. End portion 130 may be designed based at least in part on a device or instrument FSL 100 is coupled to. For example, in some applications, FSL 100 may be coupled to a low noise amplifier (LNA) module and the shape and/or width of end portion 130 can be designed to couple to the LNA (or other type of devices FSL 100 can be coupled to). Thus, it should be appreciated that the dimensions, shape and/or width of end portion 130 of center conductor 106 can be selected based at least in part on a device or instrument that FSL 100 is to be coupled with.

Figure 2:
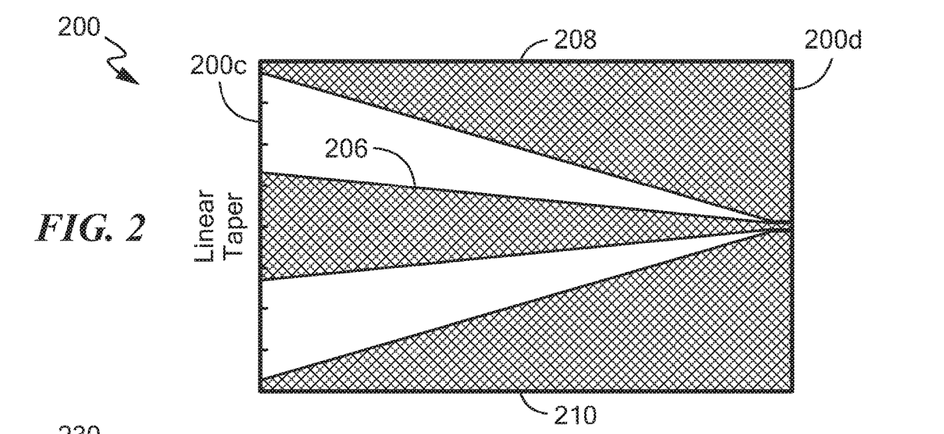
FIG. 2 is a top view of a FSL having a coplanar waveguide transmission line structure with a linearly tapered width.
Figure 2A:
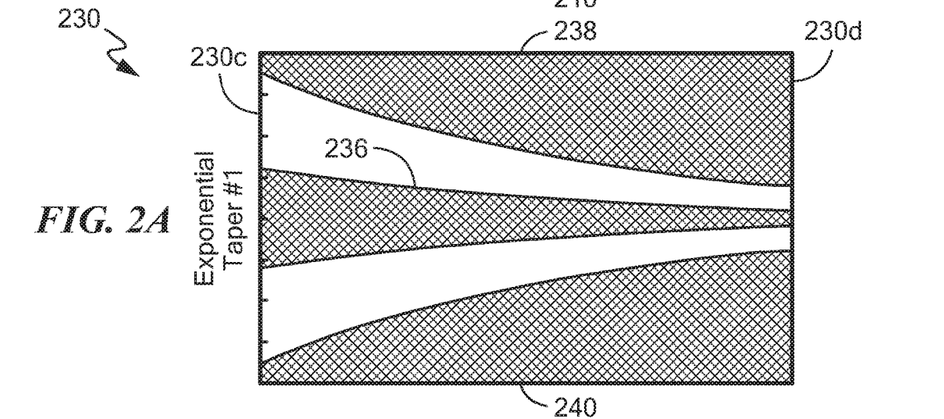
FIG. 2A is a top view of a FSL having a coplanar waveguide transmission line structure with a first embodiment of an exponentially tapered width.
Figure 2B:
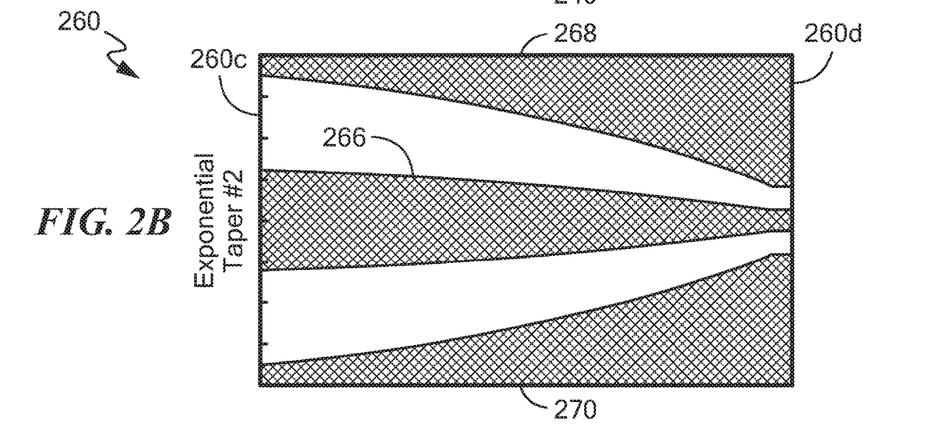
FIG. 2B is a top view of a FSL having a coplanar waveguide transmission line structure with a second embodiment of an exponentially tapered width.

Now referring to FIGS. 2-2B, top views of different coplanar waveguide transmission lines are provided having tapered widths in different configurations. The tapered width coplanar waveguide transmission line as described herein can be formed in a variety of different shapes based at least in part on a particular application of a respective FSL. For example, and referring to FIG. 2, a FSL 200 includes a coplanar waveguide transmission line with a linearly tapered width. In the illustrative embodiment of FIG. 2, a width of a center conductor 206 linearly decreases from a first end 200c to a second end 200d of FSL 200 and a width of each of first and second ground plane conductors 208, 210 linearly increases first end 200c to a second end 200d of FSL 200.

Referring now to FIG. 2A, a FSL 230 includes a coplanar waveguide transmission line with a first embodiment of an exponentially tapered width. In the illustrative embodiment of FIG. 2A, a width of a center conductor 236 exponentially decreases from a first end 230c to a second end 230d of FSL 230 and a width of each of first and second ground plane conductors 238, 240 linearly increases first end 230c to second end 230d of FSL 230.

Referring now to FIG. 2B, a FSL 260 includes a coplanar waveguide transmission line with a second embodiment of an exponentially tapered width. In the illustrative embodiment of FIG. 2B, a width of a center conductor 266 exponentially decreases from a first end 260c to a second end 260d of FSL 260 and a width of each of first and second ground plane conductors 268, 270 linearly increases first end 260c to second end 260d of FSL 260.

It should be appreciated that the tapered width coplanar waveguide transmission lines as described herein can be formed in a variety of different shapes based at least in part on dimensions of the FSL (e.g., length), a power threshold level, insertion loss factor and/or attenuation range of a respective FSL. Thus, the tapered width coplanar waveguide transmission lines can be designed and formed based at least in part on a particular application of the respective FSL and to meet specific requirements of at least one of or a combination of the following factors: dimensions of the FSL (e.g., length), a power threshold level, insertion loss factor and/or attenuation range.

Figure 3:
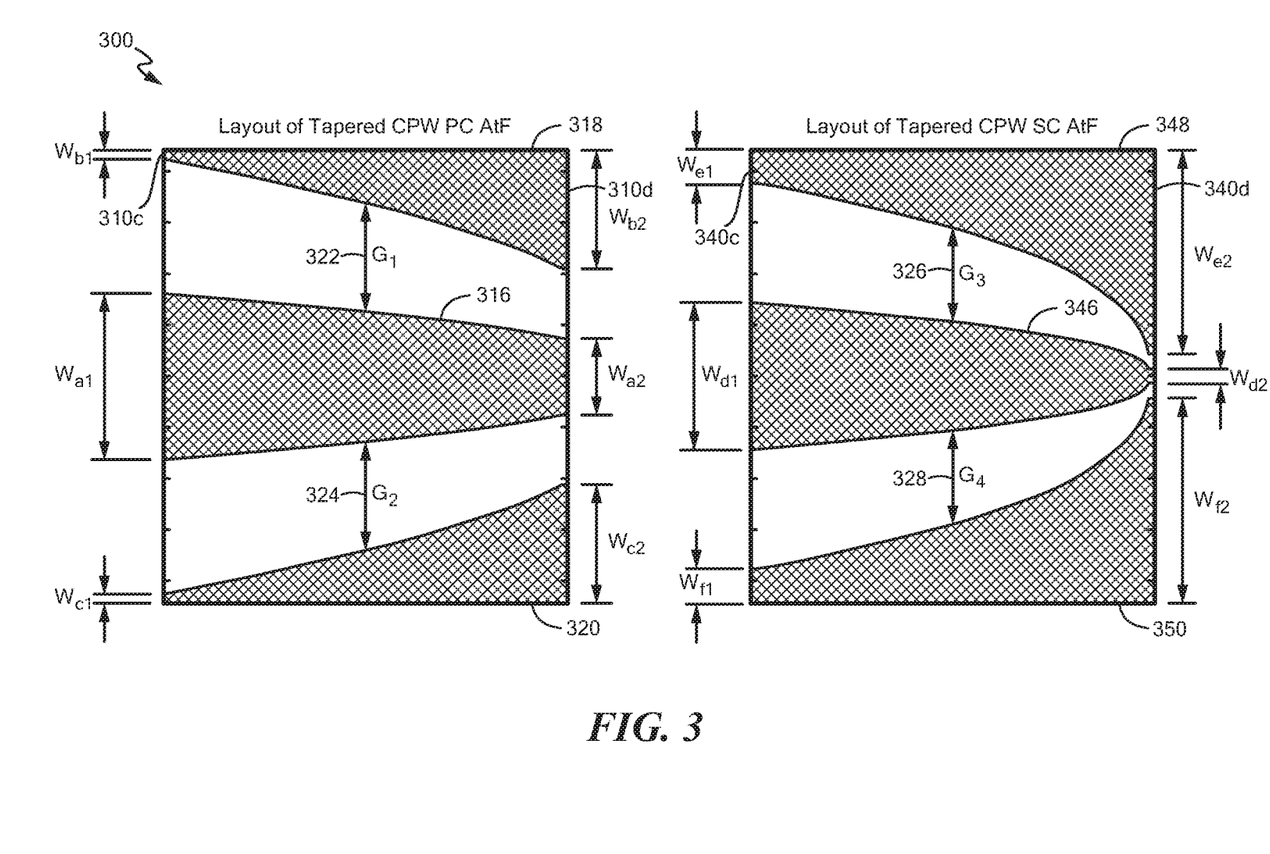
FIG. 3 is a top view of a cascaded FSL having at least two coplanar waveguide transmission line structures coupled together.

Now referring to FIG. 3, a cascaded FSL 300 includes an output 310d of a first FSL 310 coupled to an input 340c of a second FSL 340. In an embodiment, cascaded FSL 300 can be configured to operate and attenuate signals the same or in a substantially similar fashion as FSL 100 of FIGS. 1-1B, however, cascaded FSL 300 includes two or more FSLs (here two).

Each of FSLs 310, 340 include a coplanar waveguide transmission line having a tapered width. For example, first FSL 310 includes a center conductor 316 and first and second ground plane conductors 318, 320 disposed adjacent to but on opposite sides of center conductor 316. First and second ground plane conductors 318, 320 are spaced from center conductor 316 by first and second gaps 322 ($G_1$), 324 ($G_2$) respectively. Center conductor 316 has a first width $w_{a1}$ at input 310c and a second different width $w_{a2}$ at output 310d. First second ground plane conductors 318, 320 have first widths $w_{b1}$, $w_{c1}$, respectively, at input 310c and second different widths $w_{b2}$, $w_{c2}$ respectively at output 310d.

Second FSL 340 includes center conductor 346 and first and second ground plane conductors 348, 350 disposed adjacent to but on opposite sides of center conductor 346. First and second ground plane conductors 348, 350 are spaced from center conductor 346 by third and fourth gaps 326 ($G_3$), 328 ($G_4$) respectively. Center conductor 346 has a first width win at input 340c and a second different width $w_{d2}$ at output 340d. First second ground plane conductors 348, 350 have first widths $w_{e1}$, $w_{f1}$, respectively, at input 340c and second different widths $w_{e2}$, $w_{f2}$ respectively at output 340d.

In the illustrative embodiment of FIG. 3, the widths of center conductors 316, 346 decrease from their respective inputs 310c, 340c to their respective outputs 310d, 340d and the widths of first and second ground planes 318, 320, 348, 350 increase from their respective inputs 310c, 340c to their respective outputs 310d, 340d to form the tapered width. However, it should be appreciated that the widths and/or shapes of center conductors 316, 346 and first and second ground planes 318, 320, 348, 350 can be formed having a variety of different dimensions based in part on a particular application of the respective cascaded FSL.

For example, the dimensions (e.g., widths, shape) of the center conductors 316, 346 and ground plane conductors 310, 320, 348, 350 of first and second FSLs 310, 340 can be selected based at least in part on a desired power threshold level for signal attenuation, a desired characteristic impedance of cascaded FSL 300 and/or the properties of the materials within each of FSLs 310, 340. Thus, each segment (or portion) of cascaded FSL can be designed based at least in part on a previous one or more segments in cascaded FSL 300 and/or a subsequent one or more segments in cascaded FSL 300.

In an embodiment, cascaded FSL 300 can include multiple segments or portions from input 310c of first FSL 310 to output 340d of second FSL 340, thus including both first FSL 310 and second FSL 340. Each segment (or portion) of center conductors 316, 346 can have a narrower width than a previous segment to match a power threshold of an attenuated signals power level (attenuated by the previous one or more segments) and have a corresponding lower power threshold than the previous segment. For example, first width $w_{d1}$ of center conductor 346 at input 340c of second FSL 340 can be selected based in part on the second width $w_{a2}$ of center conductor 316 at output 310c of first FSL 310 and the properties of materials (e.g., magnetic material, dielectric material) making up second FSL 340. Thus, each individual segment in cascaded FSL 300 can be formed having a width that matches its power threshold level to the expected large signal power level incident upon that respective segment, where the incident power of the respective segment is a function of the large signal attenuation of one or more previous segments in cascaded FSL 300.

Cascaded FSL 300 can maintain a characteristic impedance (e.g., 50Ω) along the length of the cascaded FSL 300, thus each of first and second FSLs 310, 340 can have the same characteristic impedance over their respective lengths.

In some embodiments, first and second FSLs 310, 340 may include the same material. In other embodiments, one or more portions of first and second FSLs 310, 340 may include different material. For example, center conductor 316 and ground plane conductors 310, 320 of first FSL 310 can be disposed on a first magnetic material and center conductor 346 and ground plane conductors 348, 350 of second FSL 340 can be disposed on a second magnetic material.

First and second magnetic materials may include a ferromagnetic material, such as Yttrium iron garnet (YIG). For example, first and second magnetic materials may include at least one of a single crystal (SC) YIG, a polycrystalline (PC) YIG, a hexaferrite YIG or a variety of doped YIG materials.

In one example embodiment, first FSL 310 can be formed having a PC-YIG magnetic material and second FSL 340 can be formed having a SC-YIG magnetic material respectively. Center conductor 316 and ground plane conductors 310, 320 of first FSL 310 can be disposed on the PC-YIG and center conductor 346 and ground plane conductors 348, 350 can be disposed on the SC-YIG. As PC-YIG and SC-YIG have different power thresholds, the dimensions of first and second FSLs 310, 340 can be different based at least in part of these different properties and a respective position (e.g., first, middle, last) within cascaded FSL 300. For example, a length of first FSL 310 measured from input 310c to output 310d, may be different (greater than, less than) than a length of FSL 340 measured from input 340c to 340d.

The dimensions of center conductors 316, 346 and ground plane conductors 310, 320, 348, 350 can be different based at least in part of the different properties of first and second magnetic materials and a respective position (e.g., first, middle, last) within cascaded FSL 300. For example, first width $w_{d1}$ of center conductor 346 at input 340c of second FSL 340 can be selected based in part on the second width $w_{a2}$ of center conductor 316 at output 310c of first FSL 310 and the properties of the SC-YIG material. In some embodiments, the first width $w_{d1}$ of center conductor 346 at input 340c can be greater than the second width $w_{a2}$ of center conductor 316 at output 310c. In other embodiments, the first width $w_{d1}$ of center conductor 346 at input 340c can be equal to or less than the second width $w_{a2}$ of center conductor 316 at output 310c.

In some embodiments, the dimensions (e.g., length, width) of first and second FSLs 310, 340 may be the same. In other embodiments, one or more dimensions of first FSL 310 may be different from one or more dimensions of second FSL. For example, a total length of first FSL 310 may be greater than or less than a total length of second FSL 340.

In an embodiment, the SC-YIG material may be more expensive than the PC-YIG material. Thus, cost advantages can be achieved by forming cascaded FSL 300 using a combination of materials, such as a combination of SC-YIG material and PC-YIG material as opposed to only SC-YIG material. For example, portions of the cascaded FSL 300 can be formed using the less expensive PC-YIG material (here first FSL) and thus use less of the more expensive SC-YIG material, while achieving a desired performance (e.g., signal attenuation) of cascaded FSL 300.

It should be appreciated that although FIG. 3 illustrates cascaded FSL 300 having two FSL's, in other embodiments, a cascaded FSL may include more than two FSL's.

Each of the FSLs described herein are described and illustrated having a coplanar configuration. However, it should be appreciated that each of FSL 100 of FIGS. 1-1B, FSLs 200, 230, 260 of FIGS. 2-2B and FSLs 310, 340 of FIG. 3 can be formed having a stripline configuration.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Accordingly, other embodiments are within the scope of the following claims.

What is claimed is:

1. A frequency selective limiter comprising:
a magnetic material having first and second opposing surfaces; and
a plurality of conductors disposed on the first surface of the magnetic material to form a coplanar waveguide transmission line, wherein a first one of said plurality of conductors corresponding to a first signal conductor having a width which decreases from a first end of the coplanar waveguide transmission line to a second, different end of the coplanar waveguide transmission line.

2. The frequency selective limiter of claim 1, wherein the width of said signal conductor decreases linearly along a length of the coplanar waveguide transmission line.

3. The frequency selective limiter of claim 1, wherein the width of said signal conductor decreases exponentially along a length of the coplanar waveguide transmission line.

4. The frequency selective limiter of claim 1, wherein second ones of plurality of conductors correspond to ground plane conductors for the first signal conductor and are disposed on opposite sides of the first signal conductor.

5. The frequency selective limiter of claim 4, wherein the first signal conductor and two ground plane conductors are spaced apart such that a gap exists between respective sides of the first signal conductor and respective ones of the ground plane conductors, wherein a width of the gap decreases along a length of the coplanar waveguide transmission line.

6. The frequency selective limiter of claim 1, wherein the coplanar waveguide transmission line further comprises multiple segments having one or more different widths, and a width of each of the segments corresponds to an attenuation factor of one or more preceding segments in the coplanar waveguide transmission line or a power threshold of the one or more preceding segments in the coplanar waveguide transmission line.

7. The frequency selective limiter of claim 6, wherein each of the segments form 50Ω coplanar lines and the frequency selective limiter has a constant characteristic impedance along the length of the coplanar waveguide transmission line.

8. A frequency selective limiter comprising:
a magnetic material having first and second opposing surfaces; and
a plurality of conductors disposed on the first surface of the magnetic material to form a coplanar waveguide transmission line comprising multiple segments having one or more different widths, where the width of each of the segments corresponds to an attenuation factor of one or more preceding segments in the coplanar waveguide transmission line or a power threshold of the one or more preceding segments in the coplanar waveguide transmission line, where the power threshold of each segment decreases along a length of the coplanar waveguide transmission line,
wherein a first one of the plurality of conductors corresponds to a first signal conductor having a width which decreases from a first end of the coplanar waveguide transmission line to a second, different end of the coplanar waveguide transmission line.

9. The frequency selective limiter of claim 6, wherein each segment of the coplanar waveguide transmission line provides the same level of attenuation to a signal incident on the frequency selective limiter.

10. A cascaded frequency selective limiter system comprising:
a first frequency selective limiter comprising;
a first magnetic material having first and second opposing surfaces; and
a first plurality of conductors disposed on the first surface of the first magnetic material to form a first coplanar waveguide transmission line, wherein a first one of said first plurality of conductors corresponding to a first signal conductor having a first width which decreases from a first end of the first coplanar waveguide transmission line to a second, different end of the first coplanar waveguide transmission line;
a second frequency selective limiter comprising;
a second magnetic material having first and second opposing surfaces; and
a second plurality of conductors disposed on the first surface of the second magnetic material to form a second coplanar waveguide transmission line, wherein a first one of said second plurality of conductors corresponding to a first signal conductor having a second width which decreases from a first end of the second coplanar waveguide transmission line to a second, different end of the second coplanar waveguide transmission line; and
wherein an output of the first frequency selective limiter is coupled to an input of the second frequency selective limiter.

11. The cascaded frequency selective limiter system of claim 10, wherein the first width of said first signal conductor decreases linearly along a length of the first coplanar waveguide transmission line and the second width of said second signal conductor decreases linearly along a length of the second coplanar waveguide transmission line.

12. The cascaded frequency selective limiter system of claim 10, wherein the first and second magnetic materials comprise the same material.

13. The cascaded frequency selective limiter system of claim 10, wherein the first and second magnetic materials comprise different material.

14. The cascaded frequency selective limiter system of claim 10, wherein the second width of said second signal conductor at the first end of the second coplanar waveguide transmission line corresponds to at least one of the first width of said first signal conductor at the second end of the first coplanar waveguide transmission line, a material of the first magnetic material or a material of the second magnetic material.

15. A frequency selective limiter comprising:
a substrate comprising a magnetic material, said substrate having first and second opposing surfaces;
a center conductor disposed on the first surface of said substrate said center conductor having at least a first portion having a first end with a first width and a second end with a second different width such said center conductor is provided having a taper between the first and second ends of said first portion of said center conductor;
a first ground plane conductor disposed on the first surface of said substrate with an edge of said first ground plane conductor spaced apart from a first edge of said center conductor by a distance which changes from the first end of the first portion of said center conductor to the second end of the first portion of said center conductor; and a second ground plane conductor disposed on the first surface of said substrate with an edge of said second ground plane conductor spaced apart from a second edge of said center conductor by a distance which changes from the first end of the first portion of said center conductor to the second end of the first portion of said center conductor such that said center conductor, and said first and second ground plane conductors form a co-planar waveguide transmission line.

16. A method for forming a frequency selective limiter, the method comprising:

providing a magnetic material having first and second opposing surfaces;

disposing first and second ground plane conductors on the first surface of the magnetic material; and disposing a signal conductor on the first surface of the magnetic material such that the signal conductor is disposed between the first and second ground plane conductors to form a coplanar waveguide transmission line, wherein a width of the signal conductor decreases from a first end to a second, different end of the coplanar waveguide transmission line.

17. The method of claim 16, further comprising decreasing the width of the signal conductor linearly along a length of the coplanar waveguide transmission line.

18. The method of claim 16, further comprising decreasing the width of the signal conductor exponentially along a length of the coplanar waveguide transmission line.

19. The method of claim 16, further comprising forming a gap between the signal conductor and each of the first and second ground plane conductors, wherein the gap between the signal conductor and each of the first and second ground plane conductors decreases along a length of the coplanar waveguide transmission line.

20. The method of claim 16, further comprising;

forming multiple frequency selective limiters such that an output of a first frequency selective limiter is coupled to an input of a second frequency selective limiter; wherein a width of the input of the second coplanar waveguide transmission line corresponds to at least one of a width of the output of the first coplanar waveguide transmission line, a material of the first magnetic material and a material of the second magnetic material.

21. The method of claim 16, further comprising forming multiple segments having one or more different widths within the coplanar waveguide transmission line, wherein a width of each of the segments corresponds to at least one of an attenuation factor of one or more preceding segments in the coplanar waveguide transmission line or a power threshold of the one or more preceding segments in the coplanar waveguide transmission line.

22. The method of claim 21, wherein each of the segments form 50Ω coplanar lines and the frequency selective limiter has a constant characteristic impedance along the length of the coplanar waveguide transmission line.

* * * * *